US012719519B2

United States Patent
(12) United States Patent
Jo et al.

(10) Patent No.: US 12,719,519 B2
(45) Date of Patent: Aug. 25, 2026

(54) MIXER CIRCUIT

(71) Applicant: NTT, Inc., Tokyo (JP)

(72) Inventors: Teruo Jo, Tokyo (JP); Daisuke Kitayama, Tokyo (JP); Hiroyuki Takahashi, Tokyo (JP); Takeshi Sakamoto, Tokyo (JP)

(73) Assignee: NTT, INC., Tokyo (JP)

( * ) Notice: Subject to any disclaimer, the term of this patent is extended or adjusted under 35 U.S.C. 154(b) by 203 days.

(21) Appl. No.: 18/837,308

(22) PCT Filed: Feb. 15, 2022

(86) PCT No.: PCT/JP2022/005922
§ 371 (c)(1),
(2) Date: Aug. 9, 2024

(87) PCT Pub. No.: WO2023/157073
PCT Pub. Date: Aug. 24, 2023

(65) Prior Publication Data

US 2025/0141485 A1 May 1, 2025

(51) Int. Cl.
*H04B 1/18* (2006.01)
*H03D 7/14* (2006.01)
*H04B 1/00* (2006.01)

(52) U.S. Cl.
CPC ............. *H04B 1/18* (2013.01); *H03D 7/1441* (2013.01); *H04B 1/0082* (2013.01)

(58) Field of Classification Search
CPC ...... H04B 1/18; H04B 1/0082; H03D 7/1441; H03D 7/125
See application file for complete search history.

(56) References Cited

U.S. PATENT DOCUMENTS

| | | | |
|---|---|---|---|
| 2004/0212434 | A1 | 10/2004 | Nagamori et al. |
| 2006/0105732 | A1 | 5/2006 | Fujii |
| 2012/0314811 | A1 | 12/2012 | Goldfarb |
| 2020/0412300 | A1 | 12/2020 | Hamada et al. |

FOREIGN PATENT DOCUMENTS

| | | | |
|---|---|---|---|
| JP | 2004328555 | A | 11/2004 |
| JP | 2007184862 | A | 7/2007 |
| JP | 2019153861 | A | 9/2019 |

OTHER PUBLICATIONS

H. Hamada et al., "300-GHz, 100-GB/s InP-HEMT Wireless Transceiver Using a 300-GHz Fundamental Mixer," 2018 IEEE/MTT-S International Microwave Symposium—IMS, Philadelphia, PA, USA, Jun. 2018, pp. 1480-1483. As discussed in the specification.

*Primary Examiner* — Zhitong Chen
(74) *Attorney, Agent, or Firm* — Slater Matsil, LLP

(57) ABSTRACT

The mixer circuit includes a mixer, an LO matching circuit inserted between an LO signal terminal and a first terminal of the mixer, an IF matching circuit inserted between the IF signal terminal and a second terminal of the mixer, and an RF matching circuit inserted between an RF signal terminal and a third terminal of the mixer. In the RF matching circuit, a reflection characteristic is set such that a minimum value of reflection loss appears on a high-frequency side of the frequency of the LO signal.

15 Claims, 18 Drawing Sheets

MIXER CIRCUIT

CROSS-REFERENCE TO RELATED APPLICATIONS

This application is a national phase entry of PCT Application No. PCT/JP2022/005922, filed on Feb. 15, 2022, which application is hereby incorporated herein by reference.

TECHNICAL FIELD

The present invention relates to a mixer circuit that converts the frequency of electrical signals.

BACKGROUND

Among circuits constituting a transceiver for radio communication, a radar, etc., the mixer is an important circuit which plays a role of frequency conversion. In recent years, as a data rate has improved, a mixer which operates at high frequencies and has a wide band has been required.

In general, a mixer circuit operating at a high-frequency is provided with a matching circuit to match 50 Ω at respective signal terminals of local oscillator (LO), intermediate frequency (IF), and radio frequency (RF) (NPL 1). In the example shown in FIG. 14, an LO matching circuit 104 is provided at a LO signal terminal 101 of a mixer 100, an IF matching circuit 105 is provided at an IF signal terminal 102, and an RF matching circuit 106 is provided at an RF signal terminal 103.

A value obtained by normalizing the power of the RF signal or the IF signal after frequency conversion output from the mixer circuit by the power of the IF signal or the RF signal before frequency conversion input to the mixer circuit is called a conversion gain. A band in which the conversion gain is within-3 dB with the conversion gain of the mixer circuit at the frequency of the LO signal as a reference is an RF band of the mixer circuit. This RF band is greatly affected by the reflection characteristics of the matching circuits, particularly the reflection characteristic of the RF matching circuit 106. The reflection characteristic of the RF matching circuit 106 of the conventional mixer circuit are generally designed such that the reflection loss is minimized near the frequency fLO of the LO signal as shown in FIG. 15. The BRF of FIG. 15 is a desired RF band.

On the other hand, in order to widen the RF band of the mixer circuit, it is necessary to widen the band of the matching circuit, particularly, to widen the band of the RF matching circuit 106. As a conventional broadband method, there is a method of designing the RF matching circuit 106 so that a plurality of minimum values RLmin appear in the reflection characteristic as shown in FIG. 16 by using a plurality of stubs and capacitors. If the minimum value RLmin of the reflection loss is 4, at least four stubs or capacitors are required.

However, in the conventional broadband method, since it was necessary to use a large number of stubs and capacitors in the RF matching circuit 106, there was a problem such as an increase in circuit area and an increase in loss (a decrease in conversion gain). On the other hand, in the case of a mixer circuit requiring a small circuit size and a low loss (high conversion gain), since many stubs and capacitors cannot be used for the RF matching circuit 106, it is difficult to widen the RF band.

If the RF matching circuit 106 is designed to have only one minimum value RLmin of the reflection loss near the frequency of 270 GHz of the LO signal as shown in FIG. 17, the conversion gain characteristics of the mixer circuit when using the RF matching circuit 106 are as shown in FIG. 18. According to FIGS. 17 and 18, since the reflection loss of the RF matching circuit 106 increases as the LO signal goes away from the frequency 270 GHz, and the RF signal also attenuates, the RF band becomes a narrow range of 55 GHz in width from 235 GHz to 290 GHz.

CITATION LIST

Non Patent Literature

NPL 1 Hiroshi Hamada, et al., "300-GHz, 100-Gb/s InP-HEMT wireless transceiver using a 300-GHz fundamental mixer", 2018 IEEE/MTT-S International Microwave Symposium-IMS, IEEE, 2018

SUMMARY

Technical Problem

Embodiments of the present invention were made to solve above problem, and an object thereof is to provide a mixer capable of widening the RF band, while maintaining a small area and low loss.

Solution to Problem

A mixer circuit of embodiments of the present invention includes a mixer configured to either receive an LO signal and an IF signal and output an RF signal, or receive the LO signal and the RF signal and output the IF signal; an LO matching circuit inserted between a LO signal terminal and a first terminal of the mixer and configured to match an impedance of the LO signal terminal with an impedance of the first terminal of the mixer viewed from the LO signal terminal; an IF matching circuit inserted between an IF signal terminal and a second terminal of the mixer and configured to match the impedance of the IF signal terminal with the impedance of the second terminal of the mixer viewed from the IF signal terminal; and a RF matching circuit inserted between an RF signal terminal and a third terminal of the mixer and configured to match the impedance of the RF signal terminal with the impedance of the third terminal of the mixer viewed from the RF signal terminal, in which the RF matching circuit has a reflection characteristic set so that a minimum value of a reflection loss appears on a high-frequency side of a frequency of the LO signal.

In one configuration example of the mixer circuit of embodiments of the present invention, the RF matching circuit has a reflection characteristic set so that a minimum value of a reflection loss appears on both sides which are a low-frequency side and a high-frequency side of the frequency of the LO signal.

In one configuration example of the mixer circuit of embodiments of the present invention, the RF matching circuit has a reflection characteristic set such that the minimum value of the reflection loss on the high-frequency side is smaller than the minimum value of the reflection loss on the low-frequency side.

A mixer circuit of embodiments of the present invention includes a mixer configured to either receive an LO signal and an IF signal and output an RF signal, or receive the LO signal and the RF signal and output the IF signal; an LO matching circuit inserted between a LO signal terminal and a first terminal of the mixer and configured to match an impedance of the LO signal terminal with an impedance of the first terminal of the mixer viewed from the LO signal terminal; an IF matching circuit inserted between an IF signal terminal and a second terminal of the mixer and configured to match the impedance of the IF signal terminal with the impedance of the second terminal of the mixer viewed from the IF signal terminal; and a RF matching circuit inserted between an RF signal terminal and a third terminal of the mixer and configured to match the impedance of the RF signal terminal with the impedance of the third terminal of the mixer viewed from the RF signal terminal, in which the IF matching circuit has a reflection characteristic set such that a minimum value of a reflection loss appears on a higher frequency side from DC.

The mixer circuit of embodiments of the present invention includes a mixer configured to either receive an LO signal and an IF signal and output an RF signal, or receive the LO signal and the RF signal and output the IF signal; an LO matching circuit inserted between a LO signal terminal and a first terminal of the mixer and configured to match an impedance of the LO signal terminal with an impedance of the first terminal of the mixer viewed from the LO signal terminal; an IF matching circuit inserted between an IF signal terminal and a second terminal of the mixer and configured to match the impedance of the IF signal terminal with the impedance of the second terminal of the mixer viewed from the IF signal terminal; and a RF matching circuit inserted between an RF signal terminal and a third terminal of the mixer and configured to match the impedance of the RF signal terminal with the impedance of the third terminal of the mixer viewed from the RF signal terminal, in which the RF matching circuit has a reflection characteristic set such that a minimum value of a reflection loss appears on a high-frequency side of a frequency of the LO signal, and the IF matching circuit has a reflection characteristic set such that a minimum value of a reflection loss appears on a higher frequency side than DC.

In one configuration example of the mixer circuit of embodiments of the present invention, the RF matching circuit has a reflection characteristic set such that the minimum value of the reflection loss appears on both sides of a low-frequency side and a high-frequency side of the frequency of the LO signal.

In one configuration example of the mixer circuit of embodiments of the present invention, the mixer includes a transistor in which a gate terminal serving as the first terminal is connected to the LO matching circuit, a source terminal is connected to ground, and drain terminals serving as the second and third terminals are connected to the IF matching circuit and the RF matching circuit.

In one configuration example of the mixer circuit of embodiments of the present invention, the RF matching circuit includes a transmission line having one end connected to the RF signal terminal, and the other end connected to the third terminal of the mixer, a first capacitor having one end connected to the transmission line, and the other end connected to ground, and a second capacitor which is disposed on a side farther from the RF signal terminal than the first capacitor, has one end connected to the transmission line and the other end connected to a ground, and has a capacitance different from a capacitance of the first capacitor, and in which the capacitance of the first capacitor is smaller than the capacitance of the second capacitor.

Advantageous Effects

According to embodiments of the present invention, by setting the reflection characteristic of the RF matching circuit so that the minimum value of the reflection loss appears on the high-frequency side of the frequency of the LO signal, it is possible to widen the RF band of the mixer circuit, while maintaining a small area and a low loss.

DETAILED DESCRIPTION OF ILLUSTRATIVE EMBODIMENTS

First Example

Figure 1:
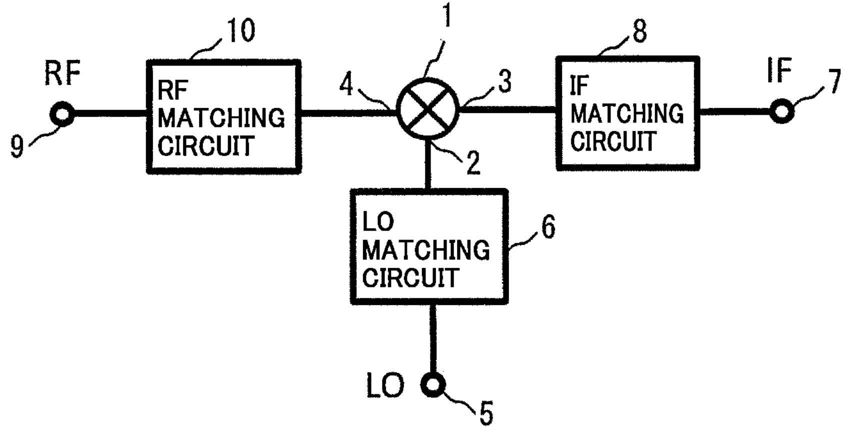
FIG. 1 is a circuit diagram of a mixer circuit according to a first example of the present invention.

Referring to the drawings, a description will be given of examples of the present invention. FIG. 1 is a circuit diagram of a mixer circuit according to a first example of the present invention. The mixer circuit includes: a mixer 1 which receives the LO signal and the IF signal and outputs the RF signal or receives the LO signal and the RF signal and outputs the IF signal; an LO matching circuit 6 which is inserted between a LO signal terminal 5 and a first terminal 2 of the mixer 1 and matches the impedance of the LO signal terminal 5 with the impedance of the first terminal 2 of the mixer 1 viewed from the LO signal terminal 5; an IF matching circuit 8 which is inserted between the IF signal terminal 7 and a second terminal 3 of the mixer 1 and matches the impedance of the IF signal terminal 7 with the impedance of the second terminal 3 of the mixer 1 viewed from the IF signal terminal 7; and a RF matching circuit 10 which is inserted between an RF signal terminal 9 and a third terminal 4 of the mixer 1 and matches the impedance of the RF signal terminal 9 with the impedance of the third terminal 4 of the mixer 1 viewed from the RF signal terminal 9.

Figure 2:
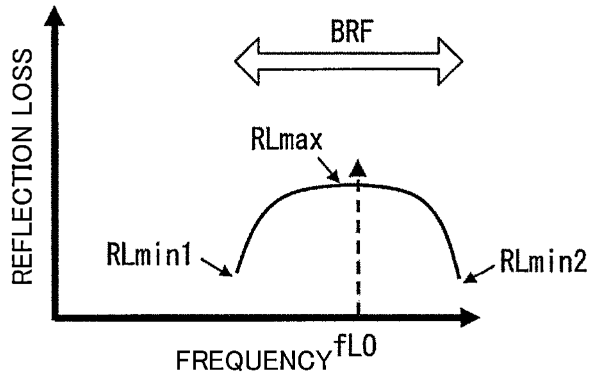
FIG. 2 is a diagram showing a reflection characteristic of an RF matching circuit according to the first example of the present invention.

In this example, the reflection characteristic of the RF matching circuit 10 are designed such that minimum values RLmin1 and RLmin2 of the reflection loss one by one appear on each of both sides of a low frequency side and a high-frequency side of the frequency fLO of the LO signal, as shown in FIG. 2. By designing the RF matching circuit 10 so that the reflection loss is large near the frequency fLO of the LO signal (for example, within a frequency range of +5%) and the reflection loss is minimized near the highest frequency and the lowest frequency of a desired RF band BRF, it is not necessary to generate many minimum values in the reflection loss of the RF matching circuit. Accordingly, it is possible to widen the RF band of the mixer circuit, while maintaining a small area and low loss.

Figure 3:
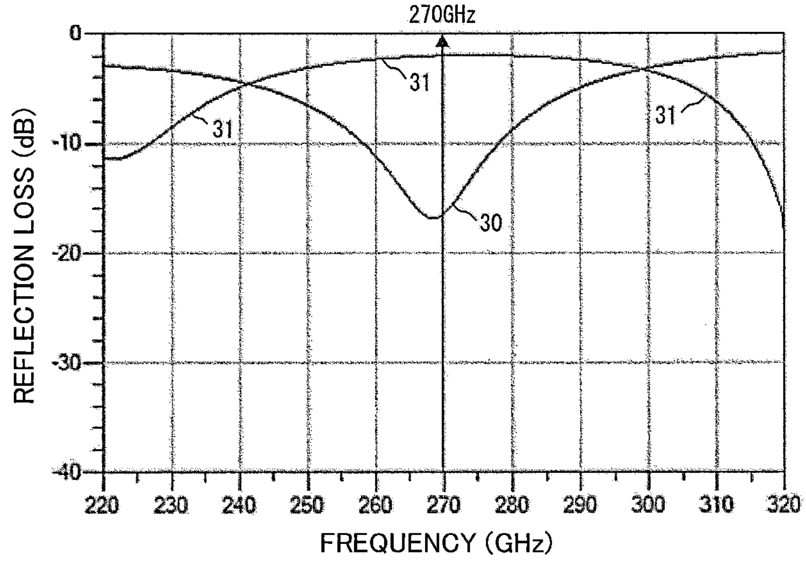
FIG. 3 is a diagram showing specific examples of a reflection characteristic of a conventional RF matching circuit and the RF matching circuit according to the first example of the present invention.

The frequency fLO of the LO signal is set to 270 GHz, the highest frequency of a desired RF band BRF is set to 320 GHz, and the lowest frequency of the RF band BRF is set to 220 GHz. The RF matching circuit 10 is designed so that the reflection loss is large in the vicinity of the frequency fLO=270 GHz of the LO signal and the reflection loss is minimum in the vicinity of the highest frequency 320 GHz and the vicinity of the lowest frequency 220 GHz of the RF band BRF. The reflection characteristic of the RF matching circuit 10 in this case are shown in FIG. 3. 30 of FIG. 3 shows a reflection characteristic of the conventional RF matching circuit 106, and 31 shows a reflection characteristic of the RF matching circuit 10 of this example.

Figure 4:
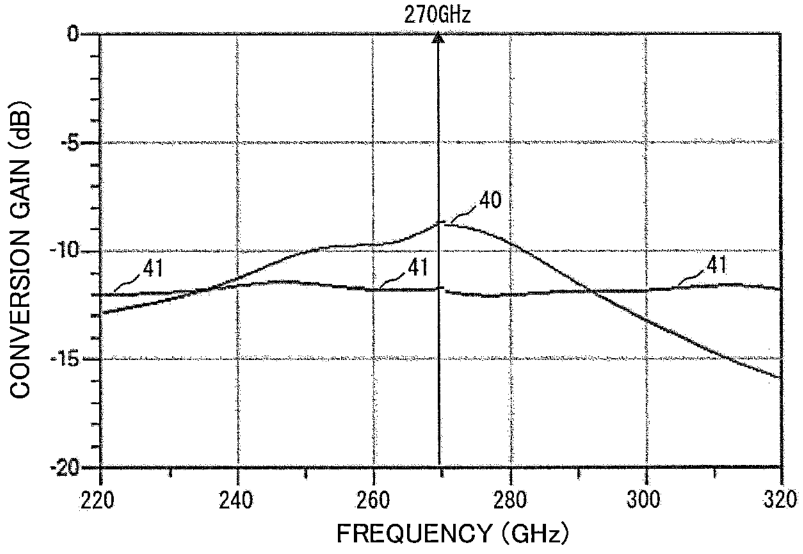
FIG. 4 is a diagram showing conversion gain characteristics of a conventional mixer circuit and a mixer circuit according to the first example of the present invention.

The conversion gain characteristics of the mixer circuit when using the RF matching circuits 106 and 10 are as shown in FIG. 4.40 of FIG. 4 shows the conversion gain characteristics of the conventional mixer circuit, and 41 shows the conversion gain characteristics of the mixer circuit of this example. According to this example, the RF bandwidth becomes 110 GHz, and it can be seen that the band can be widened as compared with the RF bandwidth 55 GHz of the conventional mixer circuit.

The mixer circuit of this example can be applied to both up-conversion and down-conversion. When the mixer circuit is used as an up-conversion mixer, an LO signal is input to the LO signal terminal 5 and the IF signal is input to the IF signal terminal 7, an RF signal is output from the RF signal terminal 9. When the mixer circuit is used as a down-conversion mixer, if the LO signal is input to the LO signal terminal 5 and the RF signal is input to the RF signal terminal 9, the IF signal is output from the IF signal terminal 7.

Further, in this example, the minimum values RLmin1 and RLmin2 of the reflection loss of the RF matching circuit 10 may be in the vicinity of the highest frequency and the vicinity of the lowest frequency of the desired RF band BRF, and the maximum value RLmax of the reflection loss may be within two minimum values RLmin1 and RLmin2. The maximum value RLmax of the reflection loss is preferably-5 dB or more, and the minimum values RLmin1 and RLmin2 of the reflection loss are preferably-10 dB or less, for example, and a loss difference between the maximum value RLmax and the minimum values RLmin1 and RLmin2 is, for example, 5 dB or more.

Second Example

As the mixer 1 of the first example, a transistor is used as described below. Generally, since a transconductance of the transistor decreases as the frequency becomes high and the loss of the wiring increases, the conversion gain of the mixer circuit decreases as the frequency becomes high, and the flatness is impaired.

Figure 5:
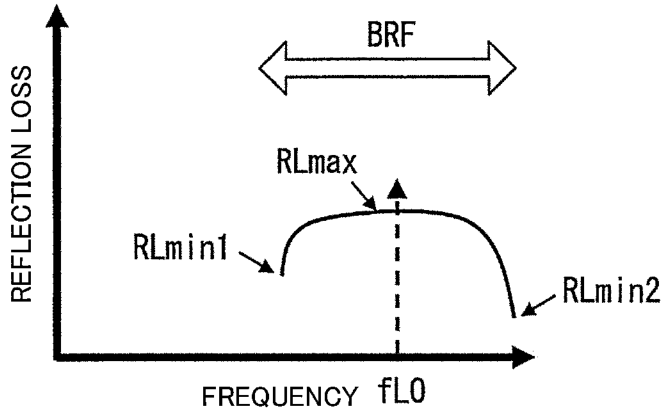
FIG. 5 is a diagram showing a reflection characteristic of the RF matching circuit according to a second example of the present invention.

Therefore, in the configuration of the first example, as shown in FIG. 5, the RF matching circuit 10 is designed so that the minimum value RLmin2 of the reflection loss in the vicinity of the highest frequency of the desired RF band BRF is smaller than the minimum value RLmin1 of the reflection loss in the vicinity of the lowest frequency of the RF band BRF. Thus, in this example, the RF band of the mixer circuit can be widened and the flatness of the conversion gain characteristics can be improved.

The minimum value RLmin1 of the reflection loss of the RF matching circuit 10 is, for example, about −10 dB, the minimum value RLmin2 is preferably, for example, −15 dB or less, and the loss difference between the minimum values RLmin1 and RLmin2 is, for example, 5 dB or more.

Third Example

Figure 6:
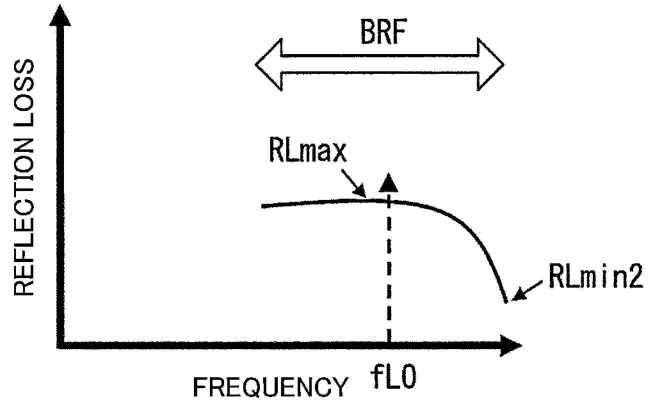
FIG. 6 is a diagram showing a reflection characteristic of the RF matching circuit according to a third example of the present invention.

In the first and second examples, the RF matching circuit 10 was designed so that the minimum values RLmin1 and RLmin2 of the reflection loss appear one by one on each of both sides of the frequency fLO of the LO signal. On the other hand, in this example, the RF matching circuit 10 is designed so that the minimum value RLmin2 appears only in the vicinity of the highest frequency higher than the frequency fLO of the LO signal in the RF band BRF as shown in FIG. 6. Thus, since the area of the RF matching circuit 10 can be reduced in this example, the RF band can be widened, and the area of the mixer circuit can be reduced and the loss can be reduced.

The minimum value RLmin2 of the reflection loss of the RF matching circuit 10 is preferably, for example, −10 dB or less, the maximum value RLmax of the reflection loss is preferably, for example, −5 dB or more, and the loss difference between the maximum value RLmax and the minimum value RLmin2 is, for example, 5 dB or more.

Fourth Example

Figure 7:
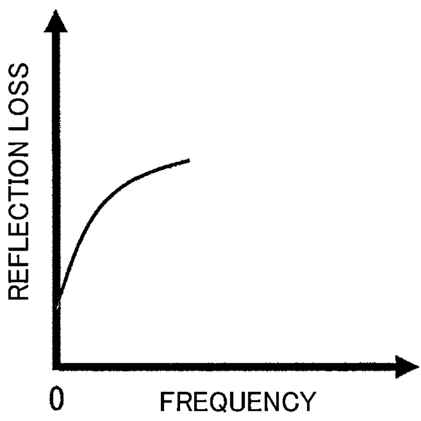
FIG. 7 is a diagram showing a reflection characteristic of a conventional IF matching circuit.

The RF band of the mixer circuit is also affected by the reflection characteristic of the IF matching circuit. The IF matching circuit 105 of the conventional mixer circuit is designed so that the reflection loss is minimized in direct current (DC) as shown in FIG. 7. However, the reflection loss of the IF matching circuit 105 is deteriorated as the frequency becomes high, and the IF signal is attenuated. As a result, the RF signal converted by the mixer circuit is attenuated as it goes away from the LO frequency, and the RF bandwidth is deteriorated.

Figure 8:
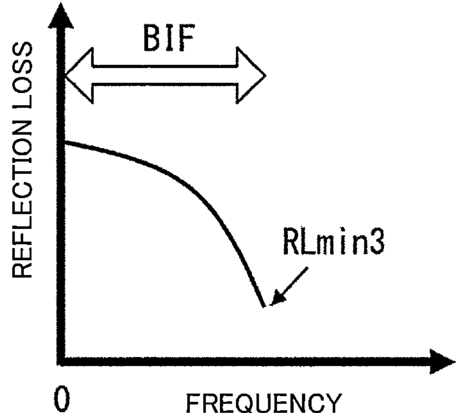
FIG. 8 is a diagram showing a reflection characteristic of an IF matching circuit according to a fourth example of the present invention.

Therefore, in the configuration of the first example, as shown in FIG. 8, the IF matching circuit 8 is designed so that the reflection loss decreases from DC toward the high-frequency side, and the minimum value RLming of the reflection loss appears on the high-frequency side than DC.

Specifically, the minimum value RLmin3 of the reflection loss appears near the highest frequency of the desired IF band BIF. The IF bandwidth is equal to half the RF bandwidth in the case of a double sideband mixer. In this example, the RF band of the mixer circuit can be widened. Furthermore, in this example, frequency ripples in the RF band can be suppressed.

The minimum value RLming of the reflection loss of the IF matching circuit 8 is preferably, for example, −10 dB or less, the maximum value RLmax of the reflection loss is preferably, for example, −5 dB or more, and the loss difference between the maximum value RLmax and the minimum value RLming is, for example, 5 dB or more.

Fifth Example

Figure 9:
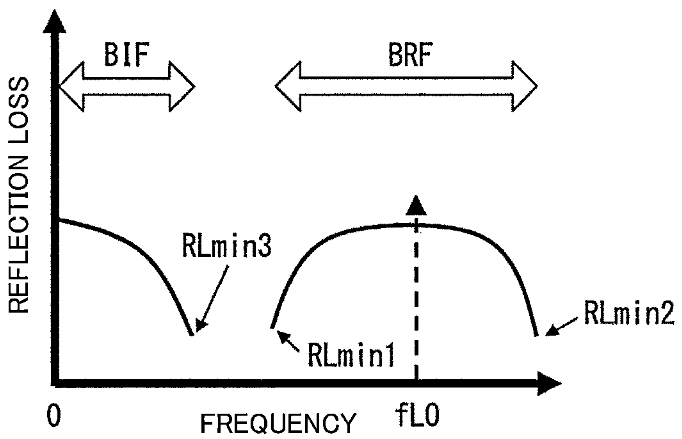
FIG. 9 is a diagram showing the reflection characteristic of an RF matching circuit and an IF matching circuit according to a fifth example of the present invention.

By combining the RF matching circuit 10 of any one of the first to third examples and the IF matching circuit 8 of the fourth example, the RF band can be further widened. An example of FIG. 9 shows a reflection characteristic when the RF matching circuit 10 of the first example and the IF matching circuit 8 of the fourth example are used.

Further, since the design parameters are increased by the combination of the first to fourth examples, the easiness of design is also improved. Further, by the combination of the first to fourth examples, it is possible to provide a peaking effect in which the conversion gain of the mixer circuit increases as it goes away the frequency fLO of the LO signal.

Sixth Example

Figure 10:
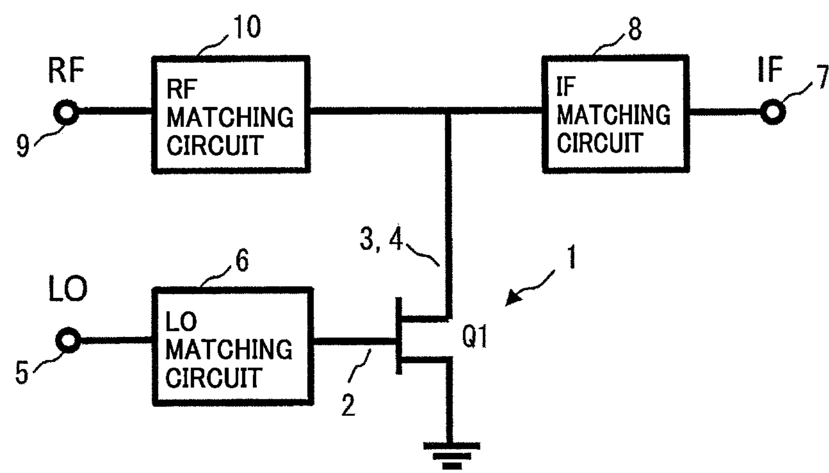
FIG. 10 is a circuit diagram of a mixer circuit according to a sixth example of the present invention.

This example shows a specific example of the mixer 1 used in the mixer circuit of the first to fifth examples. The mixer 1 of this example is a restive mixer, and as shown in FIG. 10, a gate terminal (the first terminal 2) is connected to the LO matching circuit 6, a source terminal is connected to the ground, a drain terminal (the second terminal 3, and the third terminal 4) is made up of a transistor Q1 connected to the IF matching circuit 8 and the RF matching circuit 10.

Since the restive mixer has high linearity and can be made up of a single transistor Q1, the area can be reduced. Since the restive mixer is a mixer for performing multiplication by using a change in drain resistance of the transistor Q1, design of a matching circuit, especially design of a minimum value of reflection loss on a high-frequency side is facilitated.

Seventh Example

Figure 11:
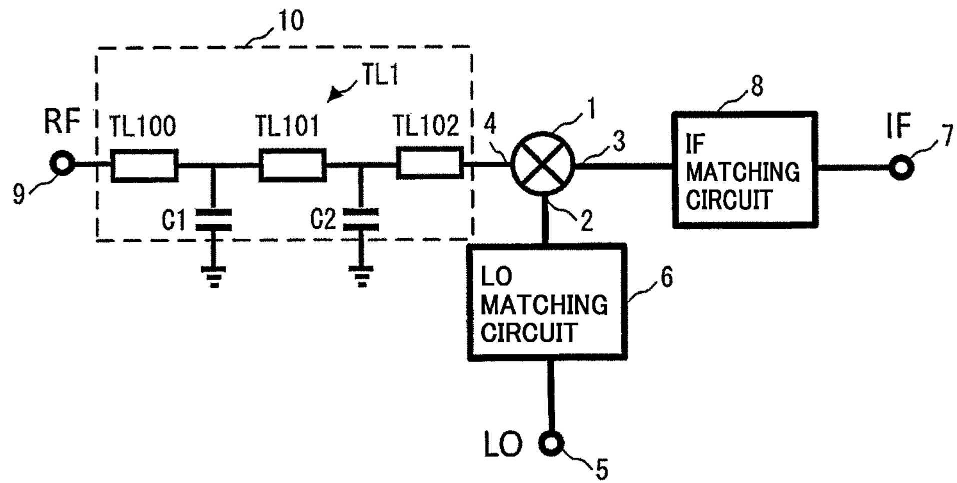
FIG. 11 is a circuit diagram of an RF matching circuit according to a seventh example of the present invention.

This example shows a specific example of the matching circuit used in the mixer circuits of the first to sixth examples. The RF matching circuit 10 of the first and second examples includes, for example, as shown in FIG. 11, a transmission line TL1 having one end connected to the RF signal terminal 9 and the other end connected to the third terminal 4 of the mixer 1, and two capacitors C1 and C2 of different capacities disposed along the transmission line TL1, and having one end connected to the transmission line TL1 and the other end connected to the ground. The transmission line TL1 has a configuration in which three transmission lines TL100, TL101, and TL102 are connected in series. The capacitor C1 is connected to a connection point between the transmission lines TL100 and TL101, and the capacitor C2 is connected to a connection point between the transmission lines TL101 and TL102.

In the configuration shown in FIG. 11, the capacitance of the capacitor C1 closer to the RF signal terminal 9 among the capacitors C1 and C2 is made smaller than the capacitance of the capacitor C2, thereby facilitating the design of the RF matching circuit 10, especially the design of the minimum value of the reflection loss on the high-frequency side.

Figure 12:
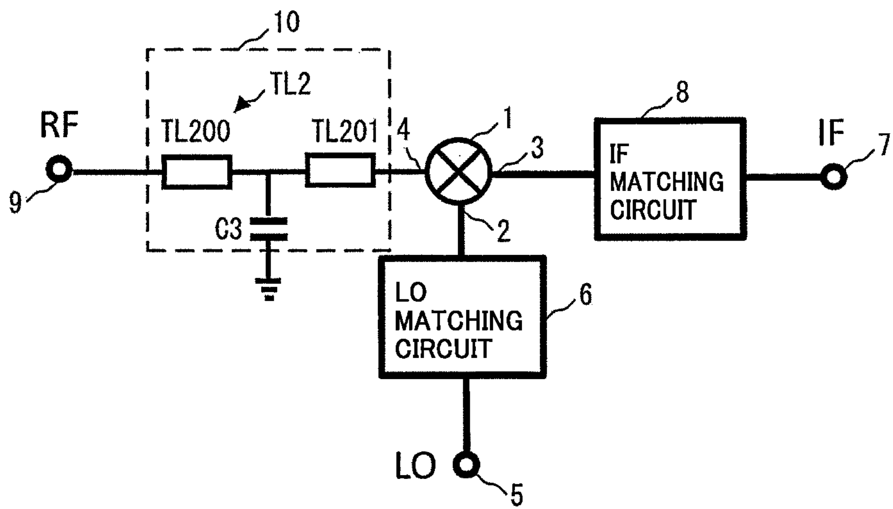
FIG. 12 is a circuit diagram of the RF matching circuit according to the seventh example of the present invention.

The RF matching circuit 10 of the third example includes, for example, as shown in FIG. 12, a transmission line TL2 having one end connected to the RF signal terminal 9 and the other end connected to the third terminal 4 of the mixer 1, and a capacitor C3 having one end connected to the transmission line TL2 and the other end connected to the ground. The transmission line TL2 has a configuration in which the two transmission lines TL200 and TL201 are connected in series. The capacitor C3 is connected to a connection point between the transmission lines TL200 and TL201.

Figure 13:
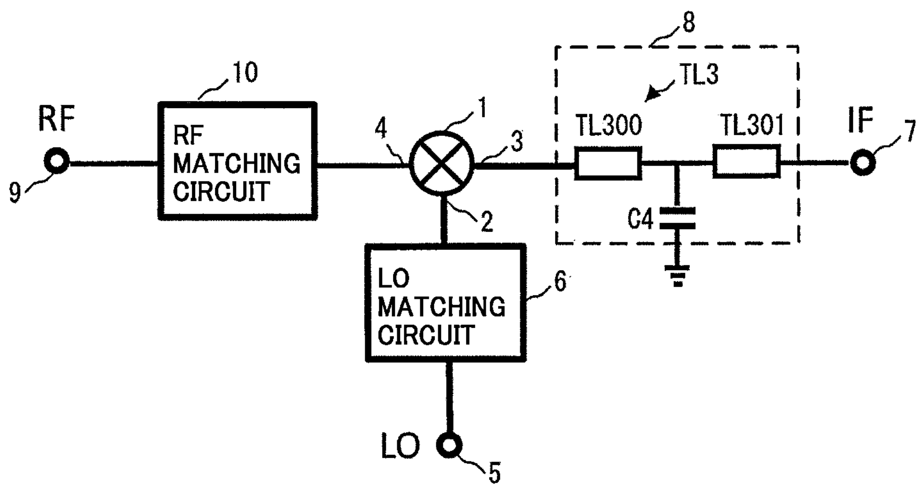
FIG. 13 is a circuit diagram of an IF matching circuit according to the seventh example of the present invention.
Figure 14:
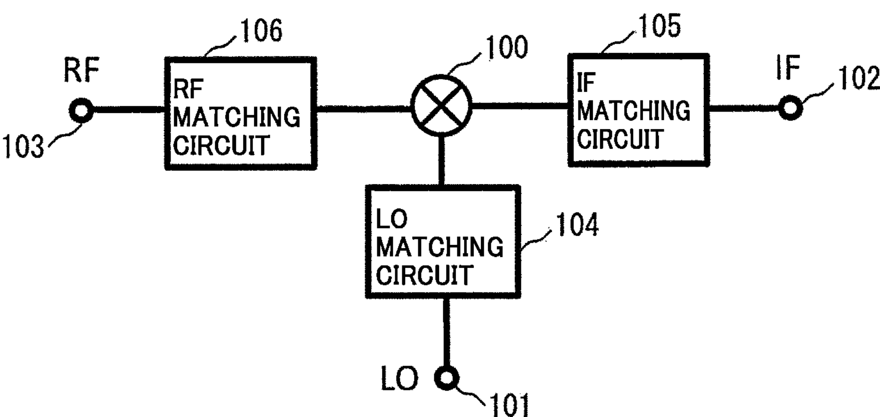
FIG. 14 is a circuit diagram of a conventional mixer circuit.
Figure 15:
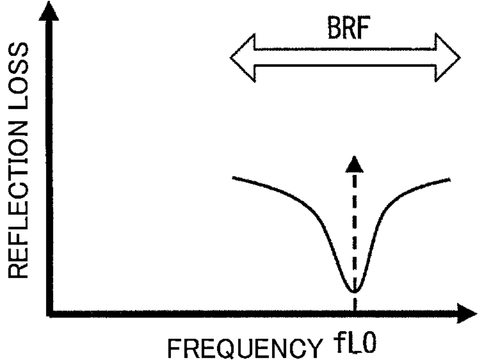
FIG. 15 is a diagram showing an example of the reflection characteristic of a conventional RF matching circuit.
Figure 16:
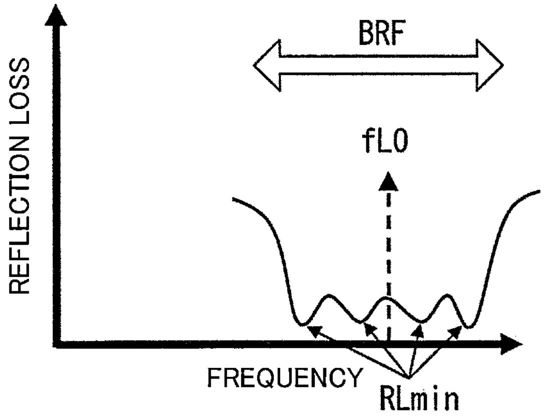
FIG. 16 is a diagram showing another example of the reflection characteristic of the conventional RF matching circuit.
Figure 17:
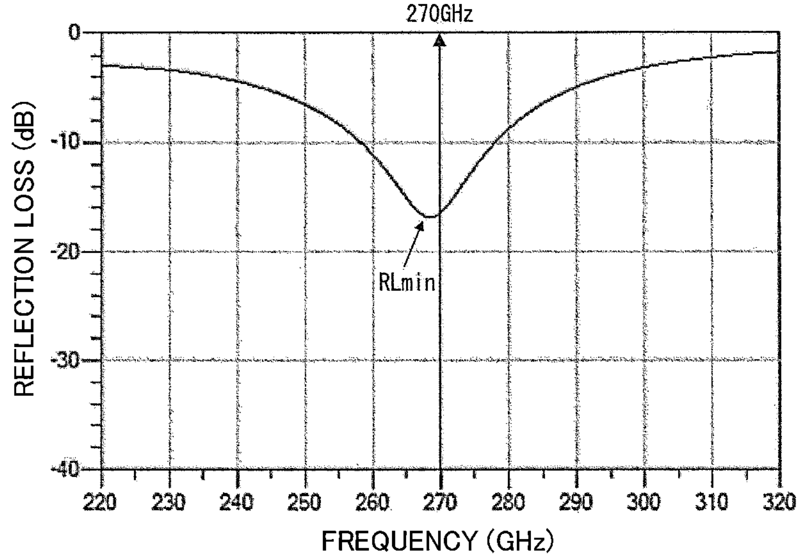
FIG. 17 is a diagram showing a specific example of the reflection characteristic of the conventional RF matching circuit.
Figure 18:
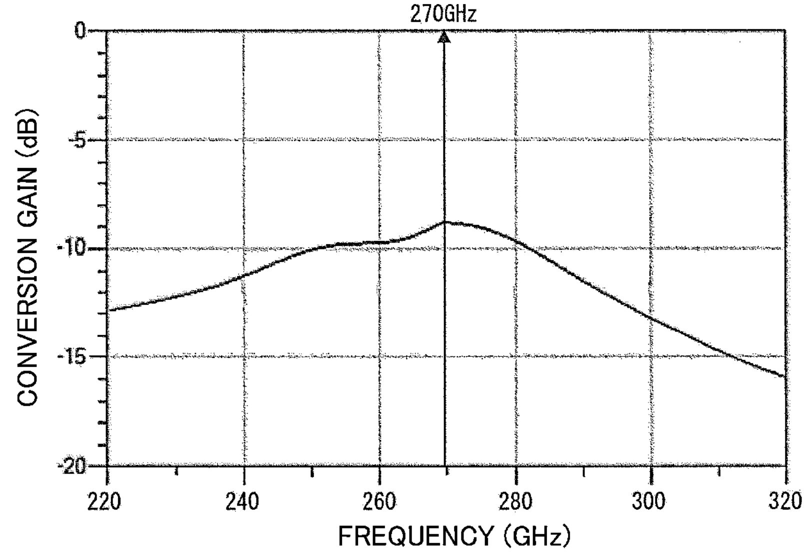
FIG. 18 is a diagram showing the conversion gain characteristics of the mixer circuit when the RF matching circuit of FIG. 17 is used.

The IF matching circuit 8 of the fourth example includes, for example, as shown in FIG. 13, a transmission line TL3 having one end connected to the IF signal terminal 7 and the other end connected to the second terminal 3 of the mixer 1, and a capacitor C4 having one end connected to the transmission line TL3 and the other end connected to the ground. The transmission line TL3 has a configuration in which the two transmission lines TL300 and TL301 are connected in series. The capacitor C4 is connected to a connection point between the transmission lines TL300 and TL301.

INDUSTRIAL APPLICABILITY

Embodiments of the present invention can be applied to a mixer circuit that converts the frequency of a signal.

REFERENCE SIGNS LIST

- 1 Mixer
- 5 LO signal terminal
- 6 LO matching circuit
- 7 IF signal terminal
- 8 IF matching circuit
- 9 RF signal terminal
- 10 RF matching circuit
- Q1 Transistor
- C1 to C4 Capacitor
- TL1 to TL3, TL100 to TL102 TL200, TL201, TL300, TL301 Transmission line

The invention claimed is:

1. A mixer circuit comprising:

a mixer configured to receive a local oscillator (LO) signal and one of an intermediate frequency (IF) signal or a radio frequency (RF) signal, and output the RF signal or the IF signal;

an LO matching circuit between a LO signal terminal and a first terminal of the mixer, the LO matching circuit being configured to match an impedance of the LO signal terminal with an impedance of the first terminal of the mixer viewed from the LO signal terminal;

an IF matching circuit between an IF signal terminal and a second terminal of the mixer, the IF matching circuit being configured to match an impedance of the IF signal terminal with an impedance of the second terminal of the mixer viewed from the IF signal terminal; and a RF matching circuit between an RF signal terminal and a third terminal of the mixer, the RF matching circuit being configured to match an impedance of the RF signal terminal with an impedance of the third terminal of the mixer viewed from the RF signal terminal, wherein the RF matching circuit has a reflection characteristic set such that a minimum value of a reflection loss appears on a high-frequency side of a frequency of the LO signal.

2. The mixer circuit according to claim 1, wherein the RF matching circuit has a reflection characteristic set such that a minimum value of a reflection loss appears on both a low-frequency side and the high-frequency side of the frequency of the LO signal.

3. The mixer circuit according to claim 2, wherein the RF matching circuit has a reflection characteristic set such that the minimum value of the reflection loss on the high-frequency side of the frequency of the LO signal is smaller than the minimum value of the reflection loss on the low-frequency side of the frequency of the LO signal.

4. The mixer circuit according to claim 3, wherein the mixer includes a transistor, the transistor comprising:

a gate terminal serving as the first terminal connected to the LO matching circuit;

a source terminal connected to ground; and drain terminals serving as the second and third terminals connected to the IF matching circuit and the RF matching circuit, respectively.

5. The mixer circuit according to claim 3, wherein the RF matching circuit includes:

a transmission line having a first end connected to the RF signal terminal, and a second end connected to the third terminal of the mixer;

a first capacitor having a first end connected to the transmission line, and a second end connected to ground; and a second capacitor disposed on a side farther from the RF signal terminal than the first capacitor, the second capacitor having a first end connected to the transmission line and a second end connected to ground, and a capacitance of the first capacitor is smaller than a capacitance of the second capacitor.

6. The mixer circuit according to claim 2, wherein the RF matching circuit includes:

a transmission line having a first end connected to the RF signal terminal, and a second end connected to the third terminal of the mixer;

a first capacitor having a first end connected to the transmission line, and a second end connected to ground; and a second capacitor disposed on a side farther from the RF signal terminal than the first capacitor, the second capacitor having a first end connected to the transmission line and a second end connected to ground, and a capacitance of the first capacitor is smaller than a capacitance of the second capacitor.

7. The mixer circuit according to claim 2, wherein the mixer includes a transistor, the transistor comprising:

a gate terminal serving as the first terminal connected to the LO matching circuit;

a source terminal connected to ground; and drain terminals serving as the second and third terminals connected to the IF matching circuit and the RF matching circuit, respectively.

8. The mixer circuit according to claim 1, wherein the mixer includes a transistor, the transistor comprising:

a gate terminal serving as the first terminal connected to the LO matching circuit;

a source terminal connected to ground; and one or more drain terminals serving as the second and third terminals connected to the IF matching circuit and the RF matching circuit.

9. A mixer circuit comprising:

a mixer configured to receive a local oscillator (LO) signal and one of an intermediate frequency (IF) signal or a radio frequency (RF) signal, and output the RF signal or the IF signal;

an LO matching circuit between a LO signal terminal and a first terminal of the mixer, the LO matching circuit being configured to match an impedance of the LO signal terminal with an impedance of the first terminal of the mixer viewed from the LO signal terminal;

an IF matching circuit between an IF signal terminal and a second terminal of the mixer, the IF matching circuit being configured to match an impedance of the IF signal terminal with an impedance of the second terminal of the mixer viewed from the IF signal terminal; and a RF matching circuit between an RF signal terminal and a third terminal of the mixer, the RF matching circuit being configured to match an impedance of the RF signal terminal with an impedance of the third terminal of the mixer viewed from the RF signal terminal, wherein the IF matching circuit has a reflection characteristic set such that a minimum value of a reflection loss appears on a higher frequency side than direct current (DC).

10. The mixer circuit according to claim 9, wherein the mixer includes a transistor, the transistor comprising:

a gate terminal serving as the first terminal connected to the LO matching circuit;

a source terminal connected to ground; and drain terminals serving as the second and third terminals connected to the IF matching circuit and the RF matching circuit, respectively.

11. A mixer circuit comprising:

a mixer configured to receive a local oscillator (LO) signal and one of an intermediate frequency (IF) signal or a radio frequency (RF) signal, and output the RF signal or the IF signal;

an LO matching circuit between a LO signal terminal and a first terminal of the mixer, the LO matching circuit being configured to match an impedance of the LO signal terminal with an impedance of the first terminal of the mixer viewed from the LO signal terminal;

an IF matching circuit between an IF signal terminal and a second terminal of the mixer, the IF matching circuit being configured to match the impedance of the IF signal terminal with the impedance of the second terminal of the mixer viewed from the IF signal terminal; and a RF matching circuit between an RF signal terminal and a third terminal of the mixer, the RF matching circuit being configured to match the impedance of the RF signal terminal with the impedance of the third terminal of the mixer viewed from the RF signal terminal, wherein the RF matching circuit has a reflection characteristic set such that a minimum value of a reflection loss appears on a high-frequency side of a frequency of the LO signal, and the IF matching circuit has a reflection characteristic set such that a minimum value of a reflection loss appears on a higher frequency side than direct current (DC).

12. The mixer circuit according to claim 11, wherein the RF matching circuit has a reflection characteristic set such that the minimum value of the reflection loss appears on both a low-frequency side and a high-frequency side of the frequency of the LO signal.

13. The mixer circuit according to claim 12, wherein the RF matching circuit includes:

a transmission line having a first end connected to the RF signal terminal, and a second end connected to the third terminal of the mixer;

a first capacitor having a first end connected to the transmission line, and a second end connected to ground; and a second capacitor disposed on a side farther from the RF signal terminal than the first capacitor, the second capacitor having a first end connected to the transmission line and a second end connected to ground, and a capacitance of the first capacitor is smaller than a capacitance of the second capacitor.

14. The mixer circuit according to claim 12, wherein the mixer includes a transistor, the transistor comprising:

a gate terminal serving as the first terminal connected to the LO matching circuit;

a source terminal connected to ground; and drain terminals serving as the second and third terminals connected to the IF matching circuit and the RF matching circuit, respectively.

15. The mixer circuit according to claim 11, wherein the mixer includes a transistor, the transistor comprising:

a gate terminal serving as the first terminal connected to the LO matching circuit;

a source terminal connected to ground; and drain terminals serving as the second and third terminals connected to the IF matching circuit and the RF matching circuit, respectively.

* * * * *